(12) United States Patent  (10) Patent No.: US 8,455,988 B2
Caparas et al.  (45) Date of Patent: Jun. 4, 2013

(54) INTEGRATED CIRCUIT PACKAGE SYSTEM WITH BUMPED LEAD AND NONBUMPED LEAD

(75) Inventors: Jose Alvin Caparas, Singapore (SG); Zigmund Ramirez Camacho, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 175 days.

(21) Appl. No.: 12/168,803

(22) Filed: Jul. 7, 2008

(65) Prior Publication Data
US 2010/0001385 A1 Jan. 7, 2010

(51) Int. Cl.
*H01L 23/495* (2006.01)
*H01L 23/48* (2006.01)
*H01L 23/52* (2006.01)
*H01L 29/40* (2006.01)

(52) U.S. Cl.
USPC .... 257/676; 257/696; 257/777; 257/E23.048; 257/E23.037

(58) Field of Classification Search
USPC ............... 257/676, 686, 777, 696, E23.048, 257/E23.037
See application file for complete search history.

(56) References Cited

U.S. PATENT DOCUMENTS

| | | | | |
|---|---|---|---|---|
| 5,214,307 | A * | 5/1993 | Davis | 257/676 |
| 5,389,739 | A * | 2/1995 | Mills | 174/540 |
| 5,578,871 | A * | 11/1996 | Fierkens | 257/676 |
| 6,072,239 | A | 6/2000 | Yoneda et al. | |
| 6,091,134 | A * | 7/2000 | Sakamoto et al. | 257/666 |
| 6,150,715 | A * | 11/2000 | Ichikawa et al. | 257/706 |
| 6,191,494 | B1 * | 2/2001 | Ooyama et al. | 257/796 |
| 6,303,985 | B1 * | 10/2001 | Larson et al. | 257/676 |
| 6,329,706 | B1 * | 12/2001 | Nam | 257/666 |
| 6,388,311 | B1 * | 5/2002 | Nakashima et al. | 257/676 |
| 6,501,160 | B1 * | 12/2002 | Higuchi et al. | 257/675 |
| 6,552,416 | B1 * | 4/2003 | Foster | 257/666 |
| 6,605,866 | B1 * | 8/2003 | Crowley et al. | 257/692 |
| 6,627,481 | B2 * | 9/2003 | Lee et al. | 438/112 |
| 6,661,083 | B2 * | 12/2003 | Lee et al. | 257/676 |
| 6,791,166 | B1 * | 9/2004 | Foster | 257/666 |
| 6,803,648 | B1 * | 10/2004 | Kelkar et al. | 257/676 |
| 6,818,973 | B1 * | 11/2004 | Foster | 257/676 |
| 6,831,352 | B1 * | 12/2004 | Tsai | 257/666 |
| 7,064,420 | B2 * | 6/2006 | Han et al. | 257/669 |
| 7,129,569 | B2 * | 10/2006 | Punzalan et al. | 257/676 |
| 7,145,222 | B2 * | 12/2006 | Gai | 257/667 |
| 7,211,471 | B1 | 5/2007 | Foster | |
| 7,245,007 | B1 * | 7/2007 | Foster | 257/678 |
| 7,270,867 | B1 | 9/2007 | Kwan et al. | |
| 7,274,089 | B2 * | 9/2007 | Punzalan et al. | 257/676 |
| 7,385,299 | B2 * | 6/2008 | Chow et al. | 257/787 |
| 7,435,619 | B2 | 10/2008 | Shim et al. | |
| 2002/0140064 | A1 * | 10/2002 | Wu et al. | 257/670 |
| 2004/0061204 | A1 * | 4/2004 | Han et al. | 257/666 |
| 2005/0046008 | A1 * | 3/2005 | Gai | 257/690 |
| 2005/0073032 | A1 * | 4/2005 | Tao | 257/676 |
| 2006/0027902 | A1 * | 2/2006 | Ararao et al. | 257/676 |

(Continued)

FOREIGN PATENT DOCUMENTS

JP 59032159 A * 2/1984

*Primary Examiner* — Teresa M Arroyo
(74) *Attorney, Agent, or Firm* — Ishimaru & Associates LLP

(57) ABSTRACT

An integrated circuit package system includes: forming an external interconnect; forming a terminal having a cavity adjacent to and downset from a portion the external interconnect; connecting a first integrated circuit with the external interconnect; and forming an encapsulation over the first integrated circuit with cavity filled with the encapsulation, the terminal extending from the encapsulation, and the external interconnect partially exposed from the encapsulation.

20 Claims, 12 Drawing Sheets

U.S. PATENT DOCUMENTS

2007/0108566 A1* 5/2007 Trasporto et al. ............. 257/676
2007/0135055 A1 6/2007 Ho et al.
2007/0176271 A1* 8/2007 Trasporto et al. ............. 257/676
2007/0187826 A1 8/2007 Shim et al.
2007/0257348 A1 11/2007 Yang
2009/0302442 A1* 12/2009 Camacho et al. ............. 257/667

* cited by examiner

INTEGRATED CIRCUIT PACKAGE SYSTEM WITH BUMPED LEAD AND NONBUMPED LEAD

TECHNICAL FIELD

The present invention relates generally to an integrated circuit package system and more particularly to an integrated circuit package system with a lead.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package. Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

Different challenges arise from increased functionality integration and miniaturization. For example, a semiconductor product having increased functionality may be made smaller but may still be required to provide a large number of inputs/outputs (I/O). The size reduction increases the I/O density or decreases the I/O pitch for the integrated circuit package and its respective integrated circuit carriers.

The ever-increasing I/O density trend presents a myriad of manufacturing problems. Some of these problems reside in integrated circuit manufacturing realm, such as fine pitch connections and reliability of these connections. Others problems involve mounting these increase I/O density integrated circuits on carriers for packaging. Yet other problems reside in the realm of the printed circuit board or the system board that receives the integrated circuit package having the fine pitch I/O or a large number of I/Os in an ever-shrinking space.

An exemplary semiconductor package, well known in the electronics industry, is the quad flat package ("QFP"). QFP packages typically comprise a lead frame, such as a conductive sheet stamped and etched, with a semiconductor die having a multitude of bond pads mounted to the top side of the lead frame. Bond wires electrically connect the bond pads, of the semiconductor die, to a series of conductive lead fingers on the topside of the lead frame. Typically, the semiconductor die and the bond wires are encapsulated within a molding compound.

In order to reduce manufacturing costs, the electronics industry is increasing the usage of QFP packages. In the manufacturing process, many obstacles must be overcome to deliver extremely small packages with thinner and thinner profile in high volume while providing connectivity to a large number of I/O. Despite the trend towards miniaturization and thinner profile, more functions and more integrated circuits are continued to be packed into QFP packages.

Thus, a need still remains for an integrated circuit package system providing low cost manufacturing, improved yield, improved reliability, and high density I/O count. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming an external interconnect; forming a terminal having a cavity adjacent to and downset from a portion the external interconnect; connecting a first integrated circuit with the external interconnect; and forming an encapsulation over the first integrated with cavity filled with the encapsulation, the terminal extending from the encapsulation, and the external interconnect partially exposed from the encapsulation.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
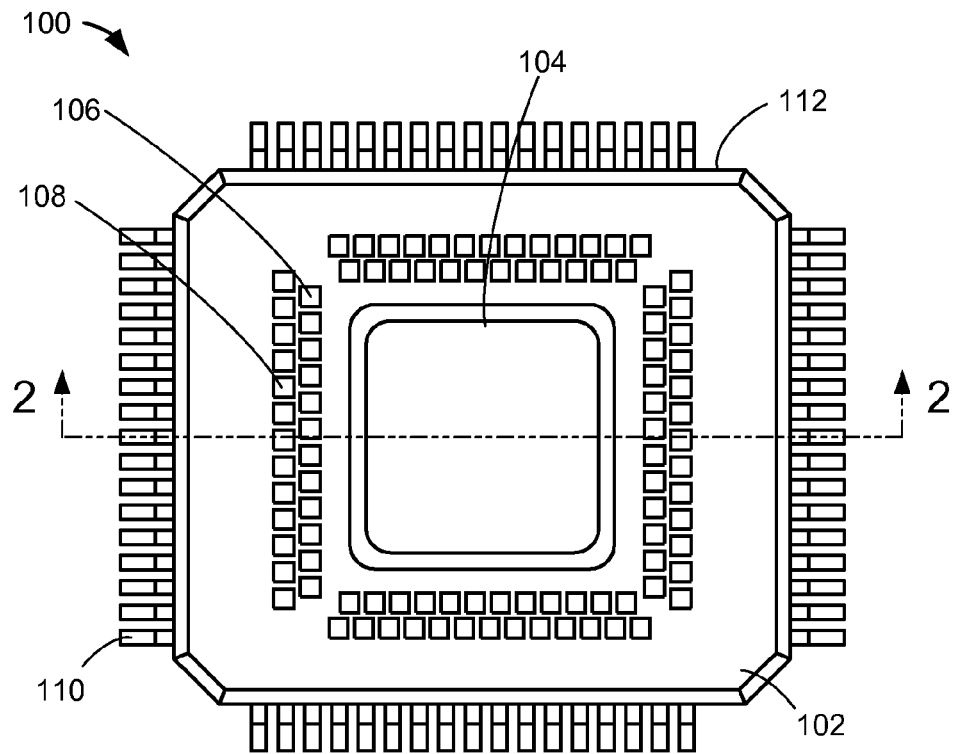
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package system 100 in a first embodiment of the present invention. The bottom view depicts an encapsulation 102, such as a cover with an epoxy molding compound, partially exposing a first terminal 104, second terminals 106, and third terminals 108. The second terminals 106 and the third terminals 108 can be adjacent to and surround the first terminal 104. External interconnects 110, such as leads, can extend from the encapsulation 102.

For illustrative purposes, the integrated circuit package system 100 is shown with one row of the second terminals 106 and one row of the third terminals 108 in a staggered configuration along all sides 112 of the integrated circuit package system 100, although it is understood that the integrated circuit package system 100 can include a different number of rows. For example, the integrated circuit package system 100 can have more than one row of the second terminals 106, more than one row of the third terminals 108, or different number of rows between the second terminals 106 and the third terminals 108 along each of the sides 112.

Figure 2:
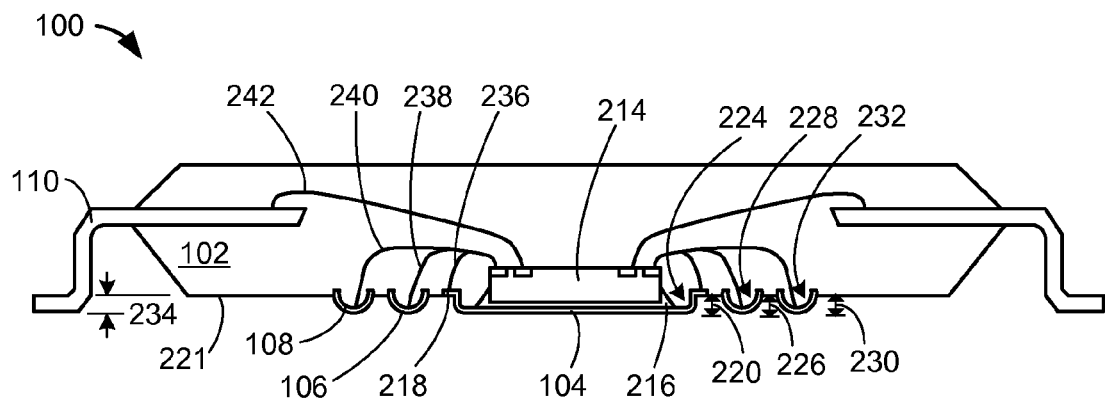
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The integrated circuit package system 100 includes a first integrated circuit 214, such as an integrated circuit die, is over the first terminal 104, such as a plated bump, with a first adhesive 216 such as a die-attach adhesive. The first adhesive 216 is on the first integrated circuit 214 and covers a portion of a vertical side of the first integrated circuit 214. The first adhesive 216 is between the first terminal 104 and the first integrated circuit 214.

The first terminal 104, such as a die-attach paddle, includes a first extension 218 at the periphery of the first terminal 104. The first terminal 104 can have a first height 220 from a first side 221 of the encapsulation 102. The first terminal 104 can also include a first cavity 224 filled with the encapsulation 102.

The second terminals 106, such as plated bumps, can be between the third terminals 108 and the first terminal 104. The second terminals 106 can have a second height 226 from the first side 221 of the encapsulation 102. Each of the second terminals 106 can also have a second cavity 228 filled with the encapsulation 102.

The third terminals 108, such as plated bumps can be adjacent to a periphery of the integrated circuit package system 100. The third terminals 108 can have a third height 230 from the first side 221 of the encapsulation 102. Each of the third terminals 108 can also include a third cavity 232 filled with the encapsulation 102.

The external interconnects 110 can extend from the non-horizontal sides of the encapsulation 102. As an example, the external interconnects 110 are shown bending towards the first side 221 of the encapsulation 102. Each of the external interconnects 110 can have an interconnect height 234 from the first side 221 of the encapsulation 102.

For illustrative purposes, the integrated circuit package system 100 is shown with the first height 220, the second height 226, the third height 230, and the interconnect height 234 as substantially the same, although it is understood that the integrated circuit package system 100 can of different heights for the first terminal 104, the third terminals 108, and the second terminals 106. For example, the third height 230, the first height 220, and the second height 226 can be substantially the same and different from the interconnect height 234. As another example, the second height 226, the third height 230, and the first height 220 can be different from one another.

First internal interconnects 236, such as bond wires, ribbon bond wires, or reverse standoff stitch bonding (RSSB), can be between the first integrated circuit 214 and the first terminal 104. Second internal interconnects 238, such as bond wires, ribbon bond wires, or reverse standoff stitch bonding (RSSB), can be between the first integrated circuit 214 and the second terminals 106 within the second cavity 228. Third internal interconnects 240 can be between the first integrated circuit 214 and the third terminals 108 within the third cavity 232. Fourth internal interconnects 242 can be between the first integrated circuit 214 and the external interconnects 110.

For illustrative purposes, the integrated circuit package system 100 is shown with the first internal interconnects 236, the second internal interconnects 238 and the third internal interconnects 240 connecting to the same connection of the first integrated circuit 214, although it is understood that the integrated circuit package system 100 can have different connections. For example, the first internal interconnects 236, the second internal interconnects 238 and the third internal interconnects 240 can connect to different portions of the first integrated circuit 214.

The encapsulation 102 can cover the first integrated circuit 214, the first internal interconnects 236, the second internal interconnects 238, the third internal interconnects 240, and the fourth internal interconnects 242. For example, the first terminal 104, the second terminals 106 and the third terminals 108, can be formed in a U-shaped terminal in a non-planar configuration extending from and below the first side 221 also depicted as a bottom surface of the encapsulation 102. For illustrative purposes, the first terminal 104, the second terminals 106 and the third terminals 108 are shown as U-shaped terminals, although it is understood that it can be of different geometric shapes, such as rectangular, triangular, or circular shapes.

The encapsulation 102 can fill the first cavity 224, the second cavity 228, and the third cavity 232 forming the first terminal 104, the second terminals 106, and the third terminals 108, respectively, as plated resin bumps. The first terminal 104, the second terminals 106, the third terminals 108 are partially exposed by the encapsulation 102 and are non-planar to and extend below the first side 221.

Figure 3:
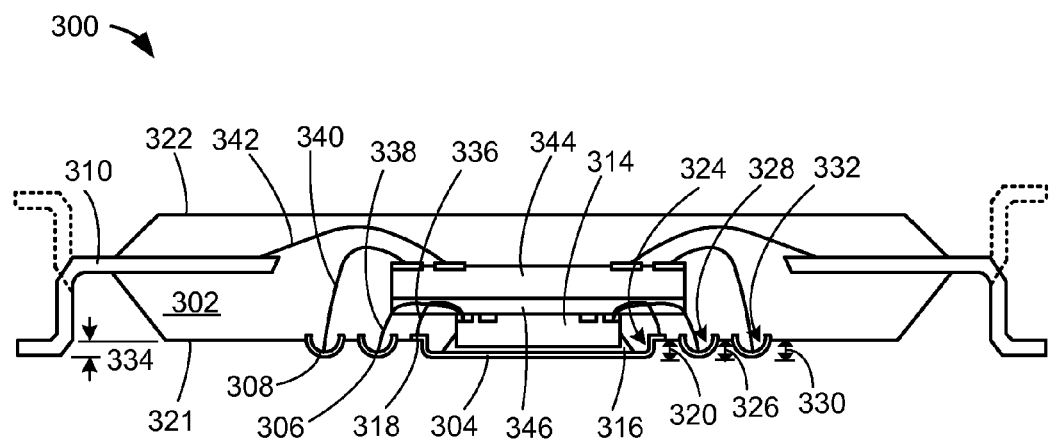
FIG. 3 is a cross-sectional view of an integrated circuit package system exemplified by the bottom view of FIG. 1 in a second embodiment of the present invention.

Referring now to FIG. 3, therein is shown a cross-sectional view of an integrated circuit package system 300 exemplified by the bottom view of FIG. 1 in a second embodiment of the present invention. The cross-sectional view depicts a first integrated circuit 314, such as an integrated circuit die, is over a first terminal 304, such as a plated bump, with a first adhesive 316 such as a die-attach adhesive.

The first terminal 304, such as a die-attach paddle, includes a first extension 318 at the periphery of the first terminal 304. The first terminal 304 can have a first height 320 from a first side 321 of an encapsulation 302. The first terminal 304 can also include a first cavity 324 filled with the encapsulation 302, such as a cover including an epoxy molding compound.

Third terminals 308, such as plated bumps can be adjacent to a periphery of the integrated circuit package system 300. The third terminals 308 can have a third height 330 from the first side 321 of the encapsulation 302. Each of the third terminals 308 can also include a third cavity 332 filled with the encapsulation 302.

Second terminals 306, such as plated bumps, can be between the third terminals 308 and the first terminal 304. The second terminals 306 can have a second height 326 from the first side 321 of the encapsulation 302. Each of the second terminals 306 can also have a second cavity 328 filled with the encapsulation 302.

External interconnects 310, such as leads, can extend from the non-horizontal sides of the encapsulation 302. As an example, the external interconnects 310 are shown bending towards the first side 321 of the encapsulation 302. As another example, the integrated circuit package system 300 can have the external interconnects 310, as depicted by dotted lines, bending to a second side 322 of the encapsulation 302. The second side 322 is an opposing side to the first side 321 of the integrated circuit package system 300. Each of the external interconnects 310 can have an interconnect height 334 from the first side 321 of the encapsulation 302.

For illustrative purposes, the integrated circuit package system 300 is shown with the first height 320, the second height 326, the third height 330, and the interconnect height 334 as substantially the same, although it is understood that the integrated circuit package system 300 can of different heights for the first terminal 304, the third terminals 308, and the second terminals 306. For example, the third height 330, the first height 320, and the second height 326 can be substantially the same and different from the interconnect height 334. As another example, the second height 326, the third height 330, and the first height 320 can be different from one another.

First internal interconnects 336, such as bond wires, ribbon bond wires, or reverse standoff stitch bonding (RSSB), can be between the first integrated circuit 314 and the first terminal 304. Second internal interconnects 338, such as bond wires, ribbon bond wires, or reverse standoff stitch bonding (RSSB), can be between the first integrated circuit 314 and the second terminals 306 within the second cavity 328.

A second integrated circuit 344, such as an integrated circuit die, can mount over the first integrated circuit 314 with a penetrable film 346, such as a wire-in-film, in between. Portions of the first internal interconnects 336 and the second internal interconnects 338 can be within the penetrable film 346. As an example, the second integrated circuit 344 and the penetrable film 346 are shown overhanging the first integrated circuit 314. As another example, the penetrable film 346 is along a non-active side of the second integrated circuit 344.

Third internal interconnects 340 can be between the second integrated circuit 344 and the third terminals 308 within the third cavity 332. Fourth internal interconnects 342 can be between the second integrated circuit 344 and the external interconnects 310.

For illustrative purposes, the integrated circuit package system 300 is shown with the first internal interconnects 336 and the second internal interconnects connecting to the same connection of the first integrated circuit 314, although it is understood that the integrated circuit package system 300 can have different connections. For example, the first internal interconnects 336 and the second internal interconnects 338 can connect to different portions of the first integrated circuit 314.

The encapsulation 302 can cover the first integrated circuit 314, the second integrated circuit 344, the penetrable film 346, the first internal interconnects 336, the second internal interconnects 338, the third internal interconnects 340, and the fourth internal interconnects 342. For example, the first terminal 304, the second terminals 306 and the third terminals 308, can be formed in a U-shaped terminal in a non-planar configuration extending below the first side 321 of the encapsulation 302. For illustrative purposes, the first terminal 304, the second terminals 306 and the third terminals 308 are shown as U-shaped terminals, although it is understood that it can be of different geometric shapes, such as rectangular, triangular, or circular shapes.

The encapsulation 302 can fill the first cavity 324, the second cavity 328, and the third cavity 332 forming the first terminal 304, the second terminals 306, and the third terminals 308, respectively, as plated resin bumps. The first terminal 304, the second terminals 306, the third terminals 308 are partially exposed by the encapsulation 302 and are non-planar to and extend below the first side 321.

Figure 4:
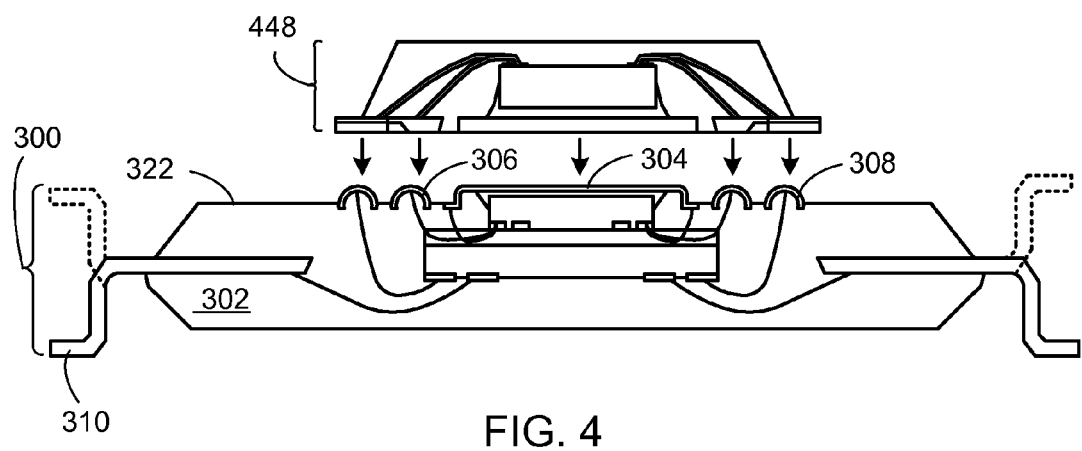
FIG. 4 is a cross-sectional view of the integrated circuit package system of FIG. 3 in a vertically flipped orientation.

Referring now to FIG. 4, therein is shown a cross-sectional view of the integrated circuit package system 300 of FIG. 3 in a vertically flipped orientation. The external interconnects 310 can be bending toward to the second side 322 of the encapsulation 302. The external interconnects 310 depicted in this figure are depicted as dotted lines in FIG. 3. An external device 448, such as a packaged integrated circuit, a flip chip, an integrated circuit die, a passive component, can mount over and connect with the third terminals 308, the second terminals 306, and the first terminal 304.

Figure 5:
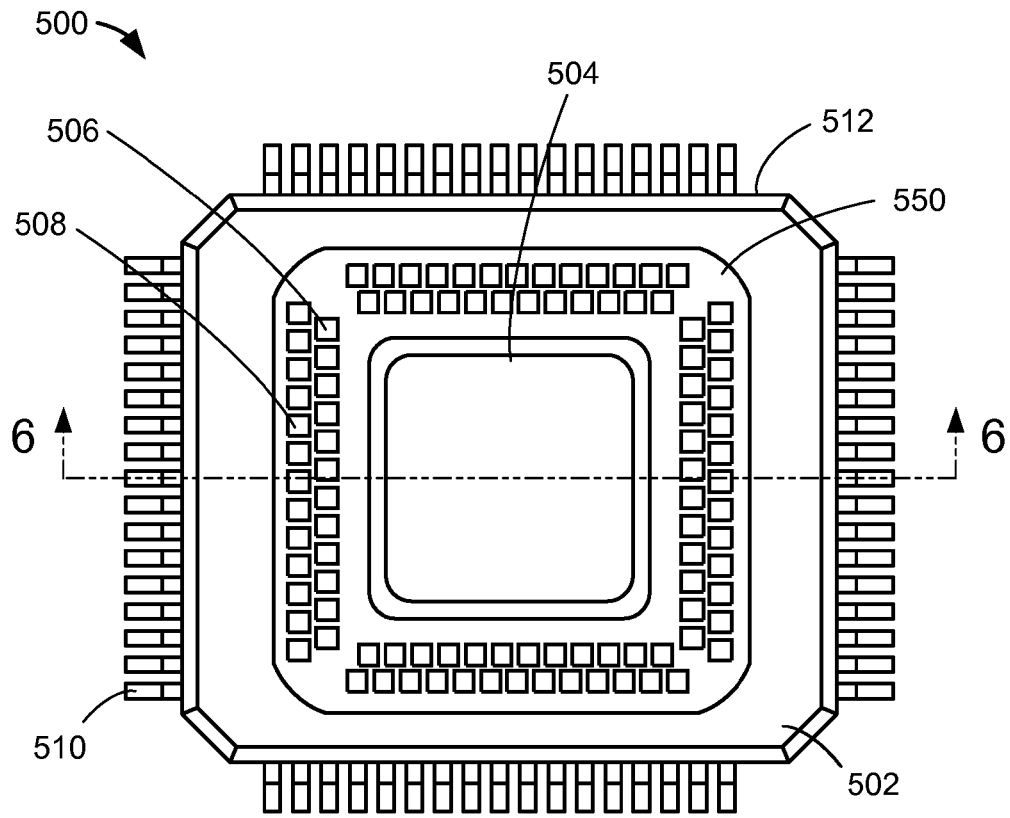
FIG. 5 is a bottom view of an integrated circuit package system in a third embodiment of the present invention.

Referring now to FIG. 5, therein is shown a bottom view of an integrated circuit package system 500 in a third embodiment of the present invention. The bottom view depicts an encapsulation 502, such as a cover with an epoxy molding compound, having a non-peripheral cavity 550. The encapsulation 502 can partially expose a first terminal 504, second terminals 506, and third terminals 508 within the non-peripheral cavity 550. The second terminals 506 and the third terminals 508 can be adjacent to and surround the first terminal 504. External interconnects 510, such as leads, can extend from the encapsulation 502.

For illustrative purposes, the integrated circuit package system 500 is shown with one row of the second terminals 506 and one row of the third terminals 508 in a staggered configuration along all sides 512 of the integrated circuit package system 500, although it is understood that the integrated circuit package system 500 can include a different number of rows. For example, the integrated circuit package system 500 can have more than one row of the second terminals 506, more than one row of the third terminals 508, or different number of rows between the second terminals 506 and the third terminals 508 along each of the sides 512.

Figure 6:
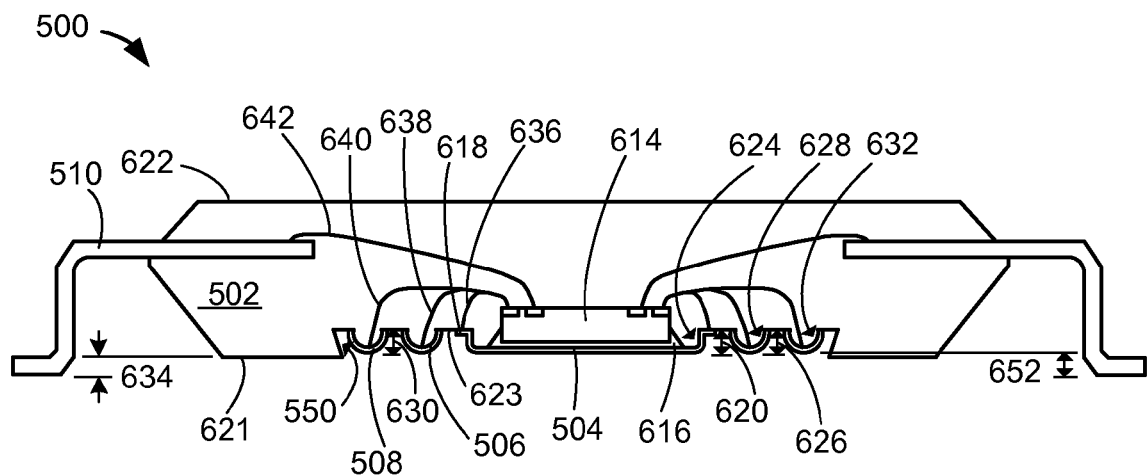
FIG. 6 is a cross-sectional view of the integrated circuit package system along line 6-6 of FIG. 5.

Referring now to FIG. 6, therein is shown a cross-sectional view of the integrated circuit package system 500 along line 6-6 of FIG. 5. The integrated circuit package system 500 includes a first integrated circuit 614, such as an integrated circuit die, is over the first terminal 504, such as a plated bump, with a first adhesive 616 such as a die-attach adhesive.

The first terminal 504, such as a die-attach paddle, includes a first extension 618 at the periphery of the first terminal 504. The first terminal 504 can have a first height 620 from a third side 623 of the encapsulation 502 within the non-peripheral cavity 550. The first terminal 504 can also include a first cavity 624 filled with the encapsulation 502.

The second terminals 506, such as plated bumps, can be between the third terminals 508 and the first terminal 504. The second terminals 506 can have a second height 626 from the third side 623 of the encapsulation 502. Each of the second terminals 506 can also have a second cavity 628 filled with the encapsulation 502.

The third terminals 508, such as plated bumps can be adjacent to a periphery of the integrated circuit package system 500. The third terminals 508 can have a third height 630 from the third side 623 of the encapsulation 502. Each of the third terminals 508 can also include a third cavity 632 filled with the encapsulation 502.

The external interconnects 510 can extend from the non-horizontal sides of the encapsulation 502. As an example, the external interconnects 510 are shown bending towards a first side 621 of the encapsulation 502. The non-peripheral cavity 550 can be from the first side 621. Each of the external interconnects 510 can have an interconnect height 634 from the third side 623 of the encapsulation 502.

For illustrative purposes, integrated circuit package system 500 is shown with a portion of the external interconnects 510, within the encapsulation 502, overhanging the first side 621 of the encapsulation 502, although it is understood that the integrated circuit package system 500 can have a different configuration of the external interconnects 510 and the first side 621. For example, the portion of the external interconnects 510, within the encapsulation 502, may not overhang the first side 621 of the encapsulation 502.

Also for illustrative purposes, the integrated circuit package system 500 is shown with the encapsulation 502 having the non-peripheral cavity 550, although it is understood that the integrated circuit package system 500 may have a different configuration for the encapsulation 502. For example, the integrated circuit package system 500 may not have the non-peripheral cavity 550.

Further for illustrative purposes, the integrated circuit package system 500 is shown with the first terminal 504 coplanar with the second terminals 506 and the third terminals 508, although it is understood that the integrated circuit package system 500 can have a different configurations of the first terminal 504, the second terminals 506, and the third terminals 508. For example, the first terminal 504 may not be coplanar with the second terminals 506 and the third terminals 508. The first terminal 504 can extend beyond the second terminals 506 and the third terminals 508 from the encapsulation 502.

The external interconnects 510 can have a stand-off height 652 with the third terminals 508, the inner terminals, the first terminal 504, or a combination thereof. The stand-off height 652 can allow the external interconnects 510 to connect to a next system level (not shown), such as a printed circuit board or another integrated circuit package system, without connecting the second terminals 506, the third terminals 508, the first terminal 504, or a combination thereof with the next system level. The stand-off height 652 is optional.

For illustrative purposes, the integrated circuit package system 500 is shown with the first height 620 the third height 630, and the second height 626 as substantially the same, although it is understood that the integrated circuit package system 500 can of different heights for the first terminal 504, the third terminals 508, and the second terminals 506. For example, the third height 630, the first height 620, and the second height 626 can be substantially the same and different from the interconnect height 634. As another example, the second height 626, the third height 630, and the first height 620 can be different from one another.

First internal interconnects 636, such as bond wires, ribbon bond wires, or reverse standoff stitch bonding (RSSB), can be between the first integrated circuit 614 and the first terminal 504. Second internal interconnects 638, such as bond wires, ribbon bond wires, or reverse standoff stitch bonding (RSSB), can be between the first integrated circuit 614 and the second terminals 506 within the second cavity 628. Third internal interconnects 640 can be between the first integrated circuit 614 and the third terminals 508 within the third cavity 632. Fourth internal interconnects 642 can be between the first integrated circuit 614 and the external interconnects 510.

For illustrative purposes, the integrated circuit package system 500 is shown with the first internal interconnects 636, the second internal interconnects 638 and the third internal interconnects 640 connecting to the same connection of the first integrated circuit 614, although it is understood that the integrated circuit package system 500 can have different connections. For example, the first internal interconnects 636, the second internal interconnects 638 and the third internal interconnects 640 can connect to different portions of the first integrated circuit 614.

The encapsulation 502 can cover the first integrated circuit 614, the first internal interconnects 636, the second internal interconnects 638, the third internal interconnects 640, and the fourth internal interconnects 642. For example, the first terminal 504, the second terminals 506 and the third terminals 508, can be formed in a U-shaped terminal in a non-planar configuration extending below the first side 621 of the encapsulation 502. For illustrative purposes, the first terminal 504, the second terminals 506 and the third terminals 508 are shown as U-shaped terminals, although it is understood that it can be of different geometric shapes, such as rectangular, triangular, or circular shapes.

Figure 7:
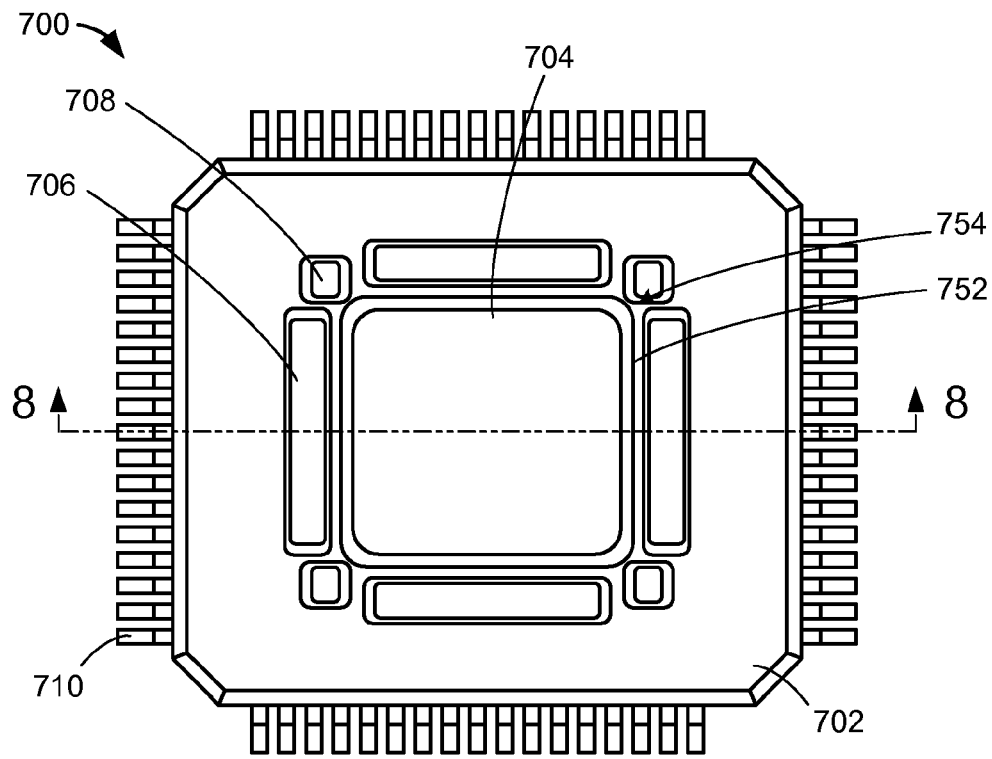
FIG. 7 is a bottom view of an integrated circuit package system in a fourth embodiment of the present invention.

Referring now to FIG. 7 is a bottom view of an integrated circuit package system 700 in a fourth embodiment of the present invention. The bottom view depicts an encapsulation 702, such as a cover with an epoxy molding compound, partially exposing a first terminal 704, second terminals 706, and third terminals 708. As an example, the second terminals 706 are shown adjacent to paddle edges 752 of the first terminal 704 and the third terminals 708 are shown adjacent to corners 754 of the first terminal 704. The second terminals 706 and the third terminals 708 can be adjacent to and surround the first terminal 704. External interconnects 710, such as leads, can extend from the encapsulation 702.

The first terminal 704, the second terminals 706, and the third terminals 708 can provide bonding sites for ground, power, or different power and grounds. For example, different grounds, such as digital ground and analog ground, can be provided with the first terminal 704, a portion or all of the second terminals 706, a portion or all of the third terminals 708, or a combination thereof.

Figure 8:
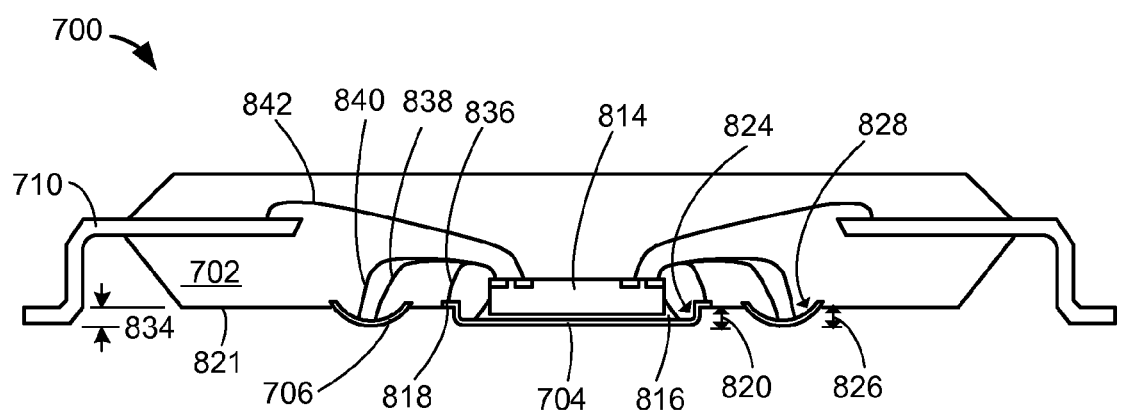
FIG. 8 is a cross-sectional view of the integrated circuit package system along line 8-8 of FIG. 7.

Referring now to FIG. 8, therein is shown a cross-sectional view of the integrated circuit package system 700 along line 8-8 of FIG. 7. The integrated circuit package system 700 includes a first integrated circuit 814, such as an integrated circuit die, is over the first terminal 704, such as a plated bump, with a first adhesive 816 such as a die-attach adhesive.

The first terminal 704, such as a die-attach paddle, includes a first extension 818 at the periphery of the first terminal 704. The first terminal 704 can have a first height 820 from a first side 821 of the encapsulation 702. The first terminal 704 can also include a first cavity 824 filled with the encapsulation 702.

The second terminals 706, such as plated bumps, can be adjacent to the third terminals 708 of FIG. 7 and the first terminal 704. The second terminals 706 can have a second height 826 from the first side 821 of the encapsulation 702. Each of the second terminals 706 can also have a second cavity 828 filled with the encapsulation 702.

The external interconnects 710 can extend from the non-horizontal sides of the encapsulation 702. As an example, the external interconnects 710 are shown bending towards the first side 821 of the encapsulation 702. Each of the external interconnects 710 can have an interconnect height 834 from the first side 821 of the encapsulation 702.

For illustrative purposes, the integrated circuit package system 700 is shown with the first height 820, the second height 826, and the interconnect height 834 as substantially the same, although it is understood that the integrated circuit package system 700 can be of different heights for the first terminal 704, the third terminals 708, and the second terminals 706. For example, the first height 820 and the second height 826 can be substantially the same and different from the interconnect height 834. As another example, the second height 826 and the first height 820 can be different from one another.

First internal interconnects 836, such as bond wires, ribbon bond wires, or reverse standoff stitch bonding (RSSB), can be between the first integrated circuit 814 and the first terminal 704. Second internal interconnects 838, such as bond wires, ribbon bond wires, or reverse standoff stitch bonding (RSSB), can be between the first integrated circuit 814 and the second terminals 706 within the second cavity 828. Third internal interconnects 840 can be between the first integrated circuit 814 and the second terminals 706 within the second cavity 828. The second internal interconnects 838 and the third internal interconnects 840 can be both attached with the second terminals 706 for improving ground or power connections with the first integrated circuit 814. Fourth internal interconnects 842 can be between the first integrated circuit 814 and the external interconnects 710.

For illustrative purposes, the integrated circuit package system 700 is shown with the first internal interconnects 836, the second internal interconnects 838 and the third internal interconnects 840 connecting to the same connection of the first integrated circuit 814, although it is understood that the integrated circuit package system 700 can have different connections. For example, the first internal interconnects 836, the second internal interconnects 838 and the third internal interconnects 840 can connect to different portions of the first integrated circuit 814.

The encapsulation 702 can cover the first integrated circuit 814, the first internal interconnects 836, the second internal interconnects 838, the third internal interconnects 840, and the fourth internal interconnects 842. For example, the first terminal 704, the second terminals 706 and the third terminals 708 of FIG. 7, can be formed in a U-shaped terminal in a non-planar configuration extending below the first side 821 of the encapsulation 702. For illustrative purposes, the first terminal 704, the second terminals 706 and the third terminals 708 are shown as U-shaped terminals, although it is understood that it can be of different geometric shapes, such as rectangular, triangular, or circular shapes.

The encapsulation 702 can fill the first cavity 824 and the second cavity 828 forming the first terminal 704 and the second terminals 706 respectively, as plated resin bumps. The first terminal 704, the second terminals 706 and the third terminals 708 of FIG. 7 are partially exposed by the encapsulation 702 and are non-planar to and extend below the first side 821.

Figure 9:
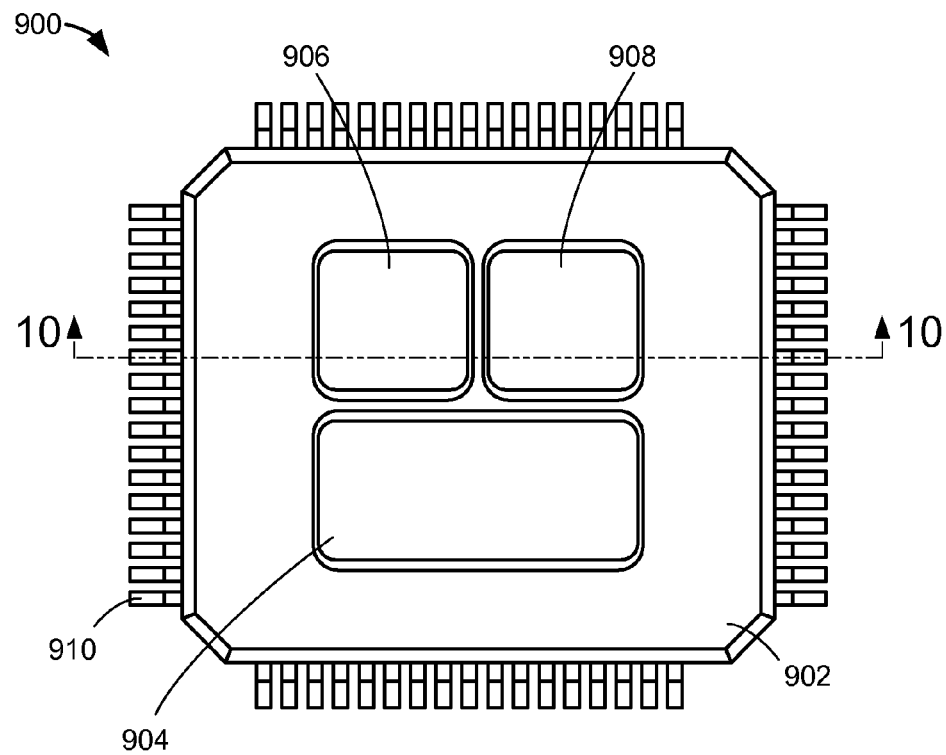
FIG. 9 is a bottom view of an integrated circuit package system in a fifth embodiment of the present invention.

Referring now to FIG. 9, therein is shown a bottom view of an integrated circuit package system 900 in a fifth embodiment of the present invention. The bottom view depicts an encapsulation 902, such as a cover with an epoxy molding compound, partially exposing a first terminal 904, a second terminal 906, and a third terminal 908. Both the second terminal 906 and the third terminal 908 can be adjacent to the first terminal 904. As an example, the first terminal 904 is shown extending along the x-axis approximately the same dimension of the second terminal 906 and the third terminal 908 combined. External interconnects 910, such as leads, can extend from the encapsulation 902.

Figure 10:
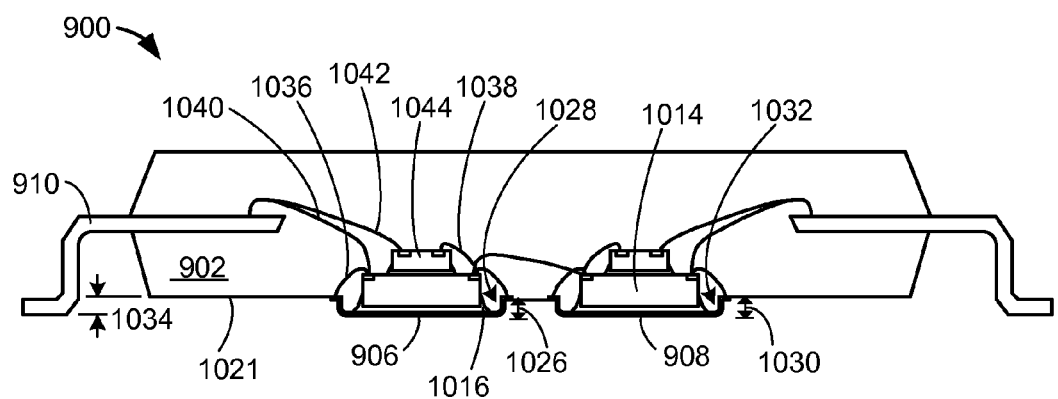
FIG. 10 is a cross-sectional view of the integrated circuit package system along line 10-10 of FIG. 9.

Referring now to FIG. 10, therein is shown a cross-sectional view of the integrated circuit package system 900 along line 10-10 of FIG. 9. The integrated circuit package system 900 includes a first integrated circuit 1014, such as an integrated circuit die, is over the second terminal 906, such as a plated bump or plated die-attach paddle, with a first adhesive 1016, such as a die-attach adhesive.

The first integrated circuit 1014 can also mount over the third terminal 908, such as a plated bump or plated die-attach paddle. For illustrative purposes, the integrated circuit package system 900 includes the first integrated circuit 1014 in both the second terminal 906 and the third terminal 908, although it is understood that the integrated circuit package system 900 can have different integrated circuits in the second terminal 906 and the third terminal 908.

A second integrated circuit 1044 can mount over the first integrated circuit 1014 over the second terminal 906 and the third terminal 908. For illustrative purposes, the integrated circuit package system 900 includes the second integrated circuit 1044 over both the second terminal 906 and the third terminal 908, although it is understood that the integrated circuit package system 900 can have different integrated circuits over the first integrated circuit 1014 within the second terminal 906 and the third terminal 908.

The second terminal 906 can have a second height 1026 from a first side 1021 of the encapsulation 902. The second terminal 906 can also include a second cavity 1028 filled with the encapsulation 902. The third terminal 908 can have a third height 1030 from the first side 1021 of the encapsulation 902. The third terminal 908 can also include a third cavity 1032 filled with the encapsulation 902.

The external interconnects 910 can extend from the non-horizontal sides of the encapsulation 902. As an example, the external interconnects 910 are shown bending towards the first side 1021 of the encapsulation 902. Each of the external interconnects 910 can have an interconnect height 1034 from the first side 1021 of the encapsulation 902.

For illustrative purposes, the integrated circuit package system 900 is shown with the second height 1026, the third height 1030, and the interconnect height 1034 as substantially the same, although it is understood that the integrated circuit package system 900 can of different heights for the third terminal 908 and the second terminal 906. For example, the third height 1030 and the second height 1026 can be substantially the same and different from the interconnect height 1034. As another example, the second height 1026 and the third height 1030 can be different from one another.

First internal interconnects 1036, such as bond wires, ribbon bond wires, or reverse standoff stitch bonding (RSSB), can connect the first integrated circuit 1014 with both the second terminal 906 and the third terminal 908. Second internal interconnects 1038, such as bond wires, ribbon bond wires, or reverse standoff stitch bonding (RSSB), can be between the first integrated circuit 1014 and the second integrated circuit 1044. Third internal interconnects 1040 can be between the first integrated circuit 1014 and the external interconnects 910. Fourth internal interconnects 1042 can be between the second integrated circuit 1044 and the external interconnects 910.

The encapsulation 902 can cover the first integrated circuit 1014, the first internal interconnects 1036, the second internal interconnects 1038, the third internal interconnects 1040, and the fourth internal interconnects 1042. For example, the first terminal 904 of FIG. 9, the second terminal 906, and the third terminal 908 can be formed in a U-shaped terminal in a non-planar configuration extending below the first side 1021 of the encapsulation 902. For illustrative purposes, the first terminal 904, the second terminal 906, and the third terminal 908 are shown as U-shaped terminals, although it is understood that it can be of different geometric shapes, such as rectangular, triangular, or circular shapes.

Figure 11:
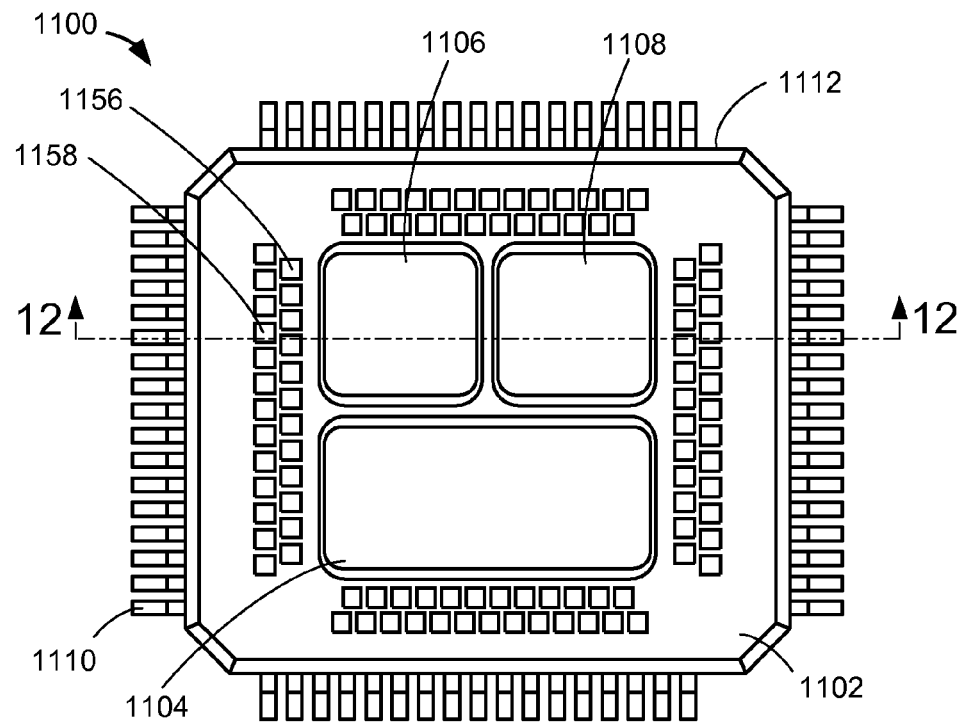
FIG. 11 is a bottom view of an integrated circuit package system in a sixth embodiment of the present invention.

Referring now to FIG. 11, therein is shown a bottom view of an integrated circuit package system 1100 in a sixth embodiment of the present invention. The bottom view depicts an encapsulation 1102, such as a cover with an epoxy molding compound, partially exposing a first terminal 1104, a second terminal 1106, and a third terminal 1108. Both the second terminal 1106 and the third terminal 1108 can be adjacent to the first terminal 1104. As an example, the first terminal 1104 is shown extending along the x-axis approximately the same dimension of the second terminal 1106 and the third terminal 1108 combined.

Fourth terminals 1156, such as plated bumps, can be adjacent to the first terminal 1104, the second terminal 1106, and the third terminal 1108. The fourth terminals 1156 can be between fifth terminals 1158, such as plated bumps, and the first terminal 1104, the second terminal 1106, the third terminal 1108, or a combination thereof. External interconnects 1110, such as leads, can extend from the encapsulation 1102.

For illustrative purposes, the integrated circuit package system 1100 is shown with one row of the fourth terminals 1156 and one row of the fifth terminals 1158 in a staggered configuration along all sides 1112 of the integrated circuit package system 1100, although it is understood that the integrated circuit package system 1100 can include a different number of rows. For example, the integrated circuit package system 1100 can have more than one row of the fourth terminals 1156, more than one row of the fifth terminals 1158, or different number of rows between the fourth terminals 1156 and the fifth terminals 1158 along each of the sides 1112.

Also for illustrative purposes, the integrated circuit package system 1100 is shown with the fourth terminals 1156 and the fifth terminals 1158 adjacent to one or two edges of the first terminal 1104, the second terminal 1106, or the third terminal 1108, although it is understood that the integrated circuit package system 1100 can have a different configuration of the terminal and rows of terminals. For example, the terminals can surround all edges of the terminal that function as a die-attach paddle.

Figure 12:
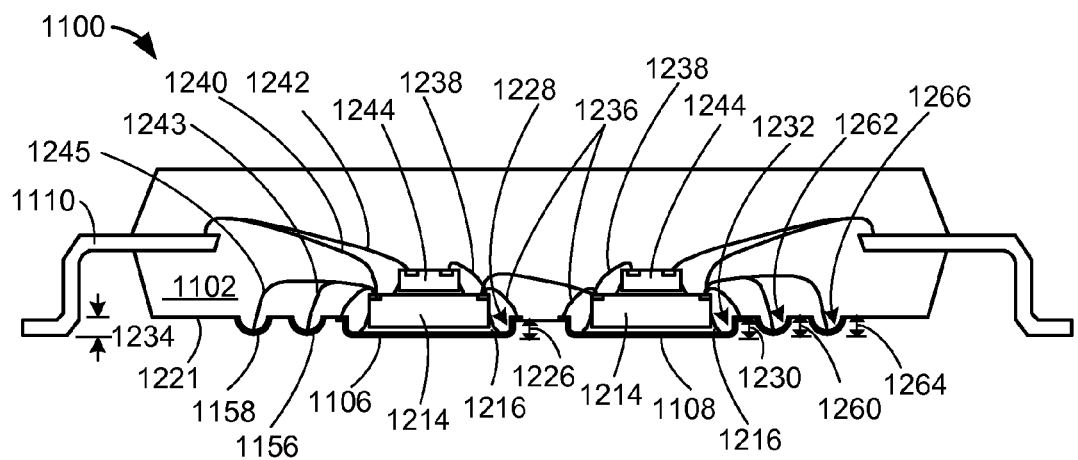
FIG. 12 is a cross-sectional view of the integrated circuit package system along line 12-12 of FIG. 1.

Referring now to FIG. 12, therein is shown a cross-sectional view of the integrated circuit package system 1100 along line 12-12 of FIG. 11. The integrated circuit package system 1100 includes a first integrated circuit 1214, such as an integrated circuit die, is over the second terminal 1106, such as a plated bump or plated die-attach paddle, with a first adhesive 1216, such as a die-attach adhesive.

The first integrated circuit 1214 can also mount over the third terminal 1108, such as a plated bump or plated die-attach paddle. For illustrative purposes, the integrated circuit package system 1100 includes the first integrated circuit 1214 in both the second terminal 1106 and the third terminal 1108, although it is understood that the integrated circuit package system 1100 can have different integrated circuits in the second terminal 1106 and the third terminal 1108.

A second integrated circuit 1244 can mount over the first integrated circuit 1214 over the second terminal 1106 and the third terminal 1108. For illustrative purposes, the integrated circuit package system 1100 includes the second integrated circuit 1244 over both the second terminal 1106 and the third terminal 1108, although it is understood that the integrated circuit package system 1100 can have different integrated circuits over the first integrated circuit 1214 within the second terminal 1106 and the third terminal 1108.

The second terminal 1106 can have a second height 1226 from a first side 1221 of the encapsulation 1102. The second terminal 1106 can also include a second cavity 1228 filled with the encapsulation 1102. The third terminal 1108 can have a third height 1230 from the first side 1221 of the encapsulation 1102. The third terminal 1108 can also include a third cavity 1232 filled with the encapsulation 1102.

The fourth terminals 1156 can be adjacent to the second terminal 1106 and the third terminal 1108. Each of the fourth terminals 1156 can have a fourth height 1260 from the first side 1221 of the encapsulation 1102. Each of the fourth terminals 1156 can also have the fourth height 1260 from the first side 1221 of the encapsulation 1102. A fourth cavity 1262 can be filled by the encapsulation 1102.

The fifth terminals 1158 can be adjacent to the fourth terminals 1156. Each of the fifth terminals 1158 can have a fifth height 1264 from the first side 1221 of the encapsulation 1102. Each of the fifth terminals 1158 can also have the fifth height 1264 from the first side 1221 of the encapsulation 1102. A fifth cavity 1266 can be filled by the encapsulation 1102.

The external interconnects 1110 can extend from the non-horizontal sides of the encapsulation 1102. As an example, the external interconnects 1110 are shown bending towards the first side 1221 of the encapsulation 1102. Each of the external interconnects 1110 can have an interconnect height 1234 from the first side 1221 of the encapsulation 1102.

For illustrative purposes, the integrated circuit package system 1100 is shown with the second height 1226, the third height 1230, and the interconnect height 1234 as substantially the same, although it is understood that the integrated circuit package system 1100 can of different heights for the third terminal 1108 and the second terminal 1106. For example, the third height 1230 and the second height 1226 can be substantially the same and different from the interconnect height 1234. As another example, the second height 1226 and the third height 1230 can be different from one another.

First internal interconnects 1236, such as bond wires, ribbon bond wires, or reverse standoff stitch bonding (RSSB), can connect the first integrated circuit 1214 with both the second terminal 1106 and the third terminal 1108. Second internal interconnects 1238, such as bond wires, ribbon bond wires, or reverse standoff stitch bonding (RSSB), can be between the first integrated circuit 1214 and the second integrated circuit 1244. Third internal interconnects 1240 can be between the first integrated circuit 1214 and the external interconnects 1110. Fourth internal interconnects 1242 can be between the second integrated circuit 1244 and the external interconnects 1110.

Fifth internal interconnects 1243 can be between the first integrated circuit die 1214 and the fourth terminals 1156. Sixth internal interconnects 1245 can be between the first integrated circuit die 124 and the fifth terminals 1156. As another example, the integrated circuit package system 1100 can have the fourth terminals 1156, the fifth terminals 1158, the external interconnects 1110, or a combination thereof connect with each other.

The encapsulation 1102 can cover the first integrated circuit 1214, the first internal interconnects 1236, the second internal interconnects 1238, the third internal interconnects 1240, and the fourth internal interconnects 1242. For example, the first terminal 1104 of FIG. 11, the second terminal 1106, the third terminal 1108, the fourth terminals 1156, and the fifth terminals 1158 can be formed in a U-shaped terminal in a non-planar configuration extending below the first side 1221 of the encapsulation 1102. For illustrative purposes, the first terminal 1104, the second terminal 1106, the third terminal 1108, the fourth terminals 1156, and the fifth terminals 1158 are shown as U-shaped terminals, although it is understood that it can be of different geometric shapes, such as rectangular, triangular, or circular shapes.

Figure 13:
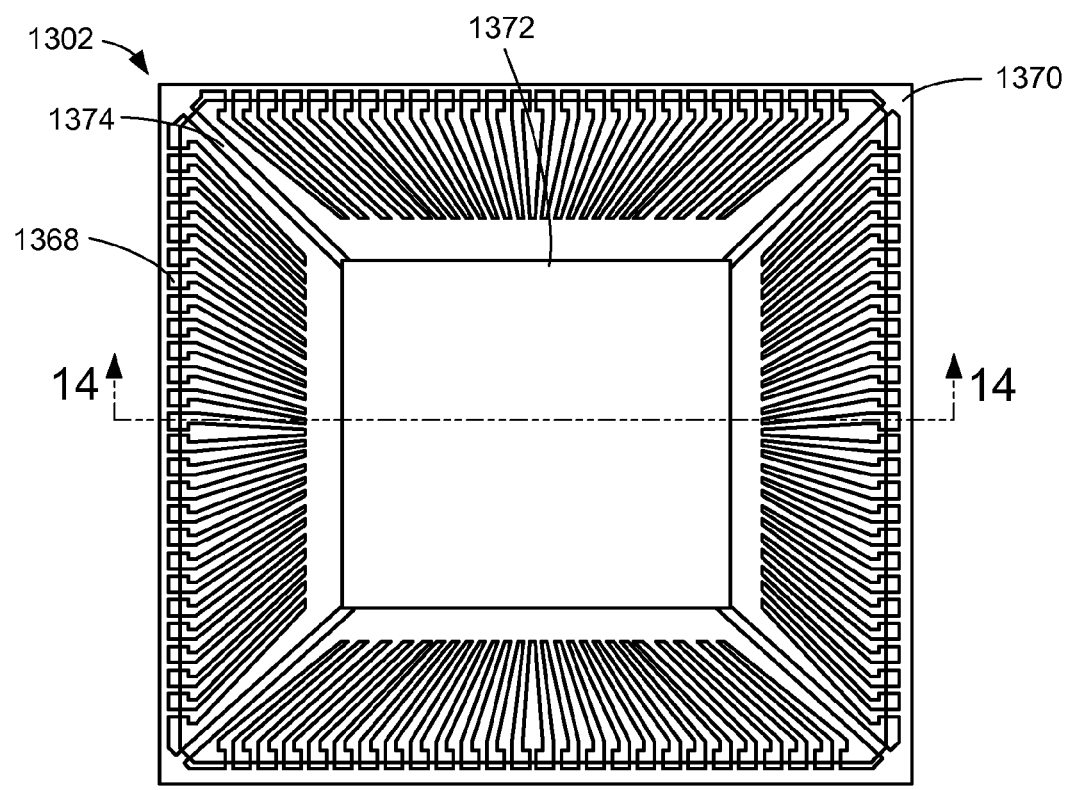
FIG. 13 is a top view a portion of a lead frame.

Referring now to FIG. 13, therein is shown a top view a portion of a lead frame 1302. The lead frame 1302, such as a copper lead frame, includes external connectors 1368, such as leads, extending from a dam bar 1370 toward a paddle 1372. Tie bars 1374 can connect the paddle 1372 and the dam bar 1370.

Figure 14:
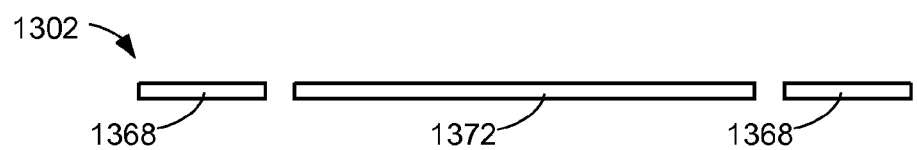
FIG. 14 is a cross-sectional view of the lead frame along 14-14 of FIG. 13.

Referring now to FIG. 14, therein is shown a cross-sectional view of the lead frame 1302 along 14-14 of FIG. 13. The cross-sectional view depicts the paddle 1372 between the external connectors 1368. As an example, the external connectors 1368 are shown coplanar with the paddle 1372.

Figure 15:
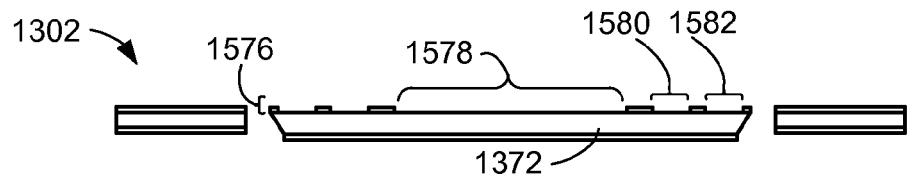
FIG. 15 is the structure of FIG. 14 in forming a first mask.

Referring now to FIG. 15, therein is shown the structure of FIG. 14 in forming a first mask 1576. The first mask 1576 can be formed underneath and over the lead frame 1302. A portion of the first mask 1576 over the paddle 1372 includes a first opening 1578 adjacent to second openings 1580. The second openings 1580 can be between the first opening 1578 and third openings 1582.

Figure 16:
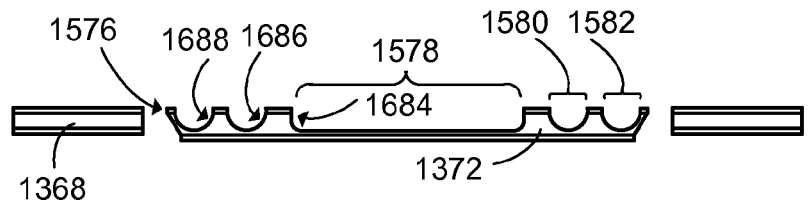
FIG. 16 is the structure of FIG. 15 in forming a first recess, second recesses, and third recesses.

Referring now to FIG. 16, therein is shown the structure of FIG. 15 in forming a first recess 1684, second recesses 1686, and third recesses 1688. The first recess 1684 can be formed by removing, such as by half etching, a portion the paddle 1372 through the first opening 1578 of the first mask 1576. The second recesses 1686 can be formed by removing a portion of the paddle 1372 through the second openings 1580 of the first mask 1576. The third recesses 1688 can be formed by removing a portion of the paddle 1372 through the third openings 1582 of the first mask 1576. The paddle 1372 can optionally be downset such that the paddle 1372 is below the external connectors 1368.

Figure 17:
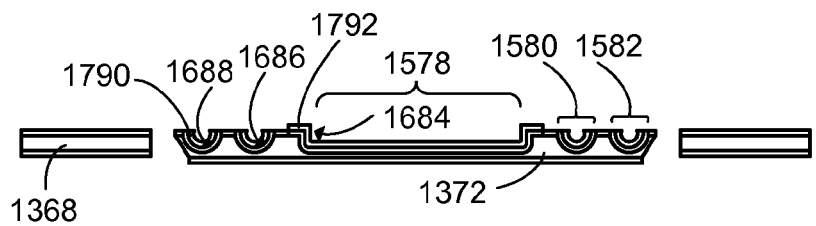
FIG. 17 is the structure of FIG. 16 in forming a conductive structure in the first recess, the second recesses, and the third recesses.

Referring now to FIG. 17, therein is shown the structure of FIG. 16 in forming a conductive structure 1790 in the first recess 1684, the second recesses 1686, and the third recesses 1688. The conductive structure 1790 can be formed in the first recess 1684 and the first opening 1578, the second recesses 1686 and the second openings 1580, and the third recesses 1688 and the third openings 1582. The conductive structure 1790 includes an extension 1792 at a peripheral portion of the conductive structure 1790 in the first recess 1684. The paddle 1372 can optionally be downset such that the paddle 1372 is below the external connectors 1368, if not in downset position.

Figure 18:
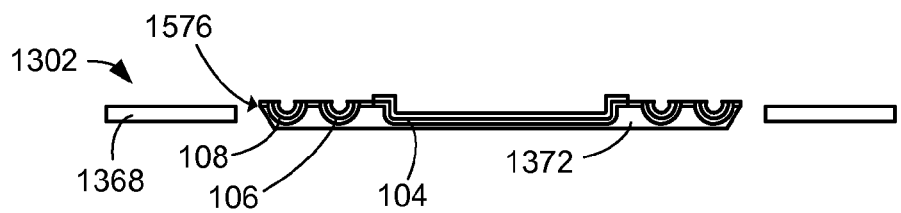
FIG. 18 is the structure of FIG. 17 in exposing the lead frame.

Referring now to FIG. 18, therein is shown the structure of FIG. 17 in exposing the lead frame 1302. The first mask 1576 of FIG. 17 has been removed exposing the lead frame 1302 previously covered by the first mask 1576. The removal of the first mask 1576 also leaves the first terminal 104, the second terminals 106 adjacent to the first terminal 104, and the third terminals 108 adjacent to the second terminals 106. The paddle 1372 can optionally be downset such that the paddle 1372 is below the external connectors 1368, if not in downset position.

Figure 19:
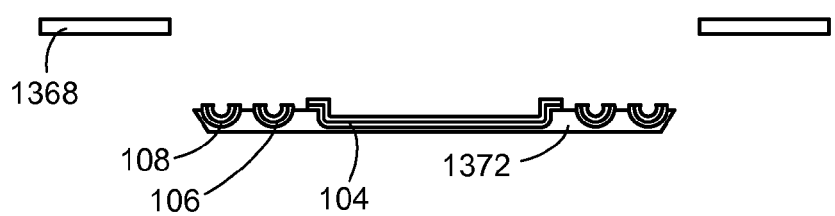
FIG. 19 is the structure of FIG. 18 in lowering the paddle.

Referring now to FIG. 19, therein is shown the structure of FIG. 18 in lowering the paddle 1372. The paddle 1372 having the first terminal 104, the second terminals 106, and the third terminals 108 can be lowered below the external connectors 1368. A number of processes can lower the paddle 1372. For example, the paddle 1372 can be downset to the lowered position.

Figure 20:
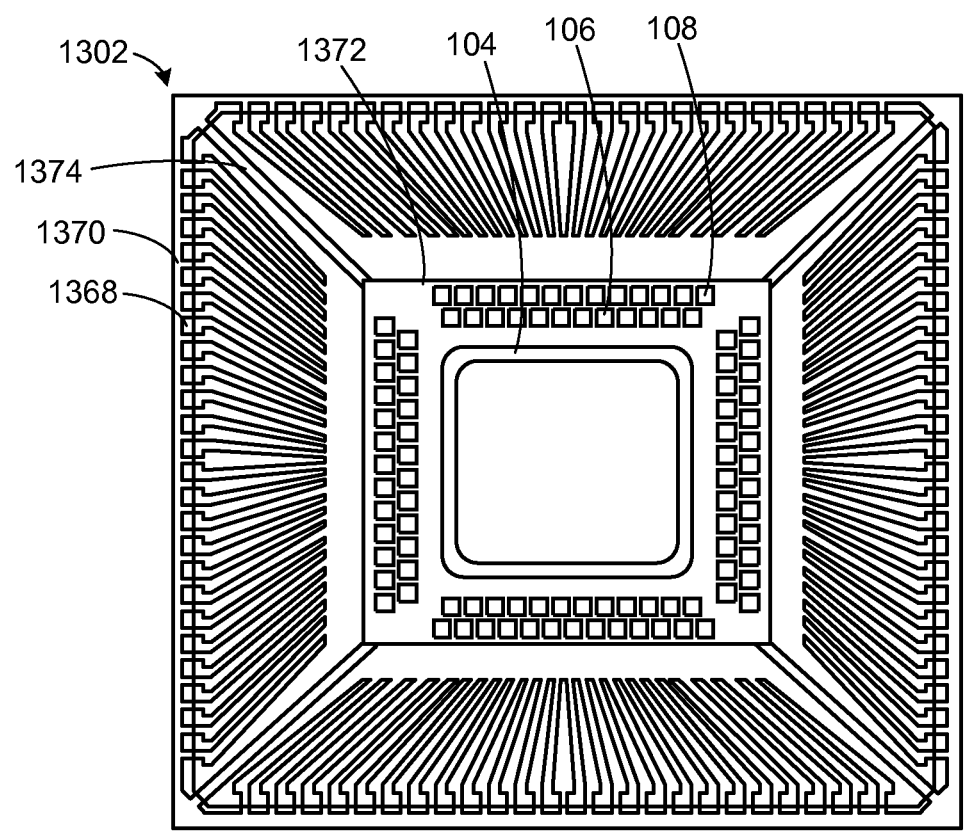
FIG. 20 is a top view of the structure of FIG. 19.

Referring now to FIG. 20, therein is shown a top view of the structure of FIG. 19. The top view depicts a portion of the lead frame 1302 having the external connectors 1368 extending from the dam bar 1370 towards the paddle 1372. The tie bars 1374 connect the paddle 1372 and the dam bar 1370. The first terminal 104 can be at the interior of the paddle 1372 and surrounded by the second terminals 106 and the third terminals 108.

Figure 21:
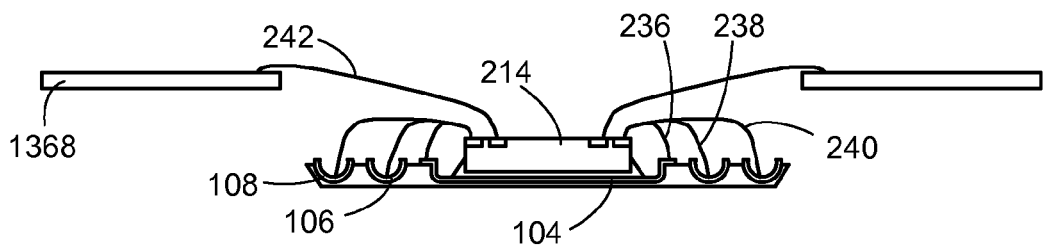
FIG. 21 is the structure of FIG. 19 in connecting the first integrated circuit.

Referring now to FIG. 21, therein is shown the structure of FIG. 19 in connecting the first integrated circuit 214. The first internal interconnects 236 can connect the first integrated circuit 214 and the first terminal 104. The second internal interconnects 238 can connect the first integrated circuit 214 and the second terminals 106. The third internal interconnects 240 can connect the first integrated circuit 214 and the third terminals 108. The fourth internal interconnects 242 can connect the first integrated circuit 214 and the external connectors 1368.

Figure 22:
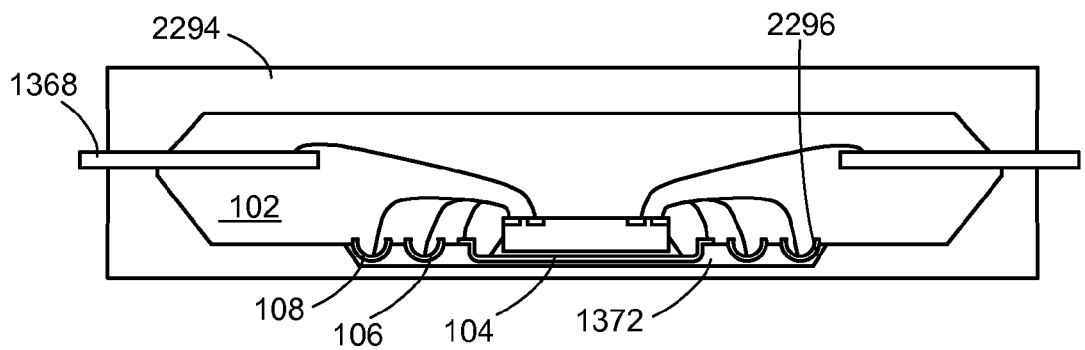
FIG. 22 is the structure of FIG. 21 in forming the encapsulation.

Referring now to FIG. 22, therein is shown the structure of FIG. 21 in forming the encapsulation 102. The structure of FIG. 21 can be placed between mold chases 2294 by the structure clamped at the external connectors 1368. The first terminal 104, the second terminals 106, and the third terminals 108 can be within the paddle 1372. The mold chases 2294 can include an indent 2296 to accommodate for the protrusion from the paddle 1372.

The encapsulation 102 can be formed by a number of processes. For example, the encapsulation 102 can be form with transfer molding the structure clamped at the external connectors 1368.

Figure 23:
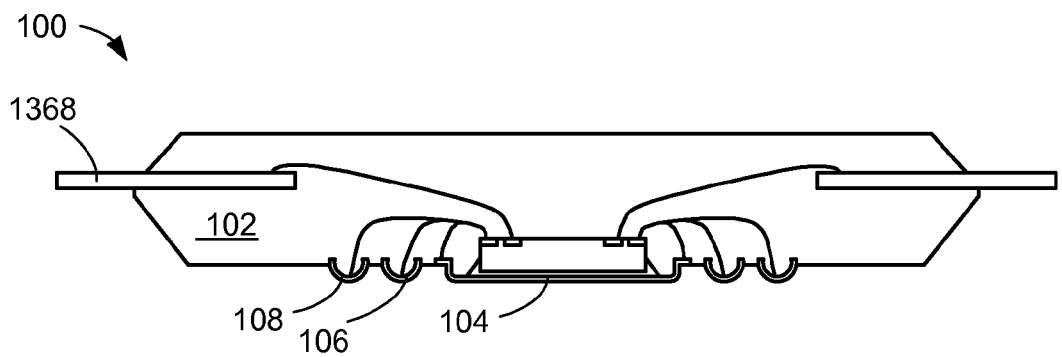
FIG. 23 is the structure of FIG. 22 in forming the integrated circuit package system of FIG. 2.

Referring now to FIG. 23, therein is shown the structure of FIG. 22 in forming the integrated circuit package system 100 of FIG. 2. The structure of FIG. 22 can undergo a removal process to remove the paddle 1372 of FIG. 22. The paddle 1372 can be removed by a number of processes. For example, the structure of FIG. 22 can be placed in a removing solution (not shown), such as an etchant solution, to remove the paddle 1372 exposing the first terminal 104, the second terminals 106, and the third terminals 108.

As another example, the paddle 1372 can be removed by a spray method where the spray removes the paddle 1372. The structure of FIG. 22 can also undergo singulation separating the structure having the encapsulation 102 and the external connectors 1368 extending therefrom. The external connectors 1368 can be bent to the desired configuration as needed forming the integrated circuit package system 100.

Figure 24:
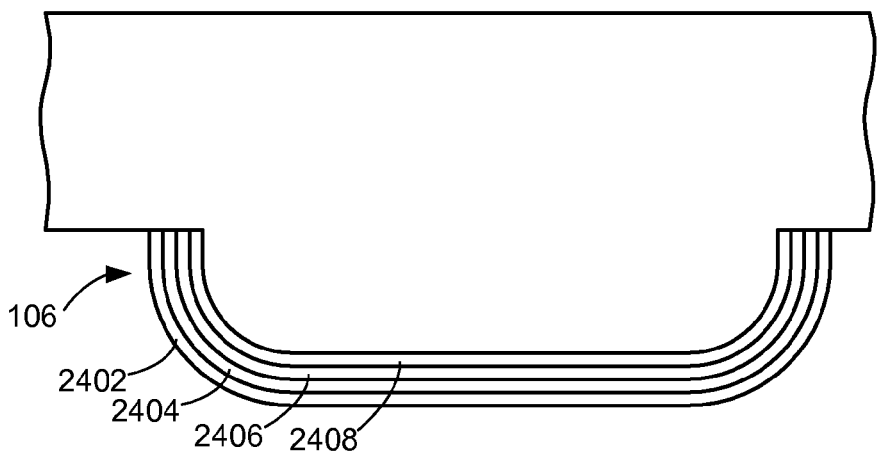
FIG. 24 is a more detailed cross-sectional view of one of the second terminals.

Referring now to FIG. 24, therein is shown a more detailed cross-sectional view of one of the second terminals 106. The second terminals 106 can be formed with a first conductive layer 2402, such as nickel palladium (NiPd) as the outermost layer. The first conductive layer 2402 must resist the removal of the paddle 1372 of FIG. 22.

A second conductive layer 2404, a third conductive layer 2406, and a fourth layer 2408 can be formed over the first conductive layer 2402. The first terminal 104 of FIG. 2, the second terminals 106, and the third terminals 108 of FIG. 2 can be formed of a single material and layer or can be formed with multiple layers, such as gold (Au), palladium (Pd), nickel (Ni), silver (Ag), tin (Sn), an alloy, or any combination thereof.

Figure 25:
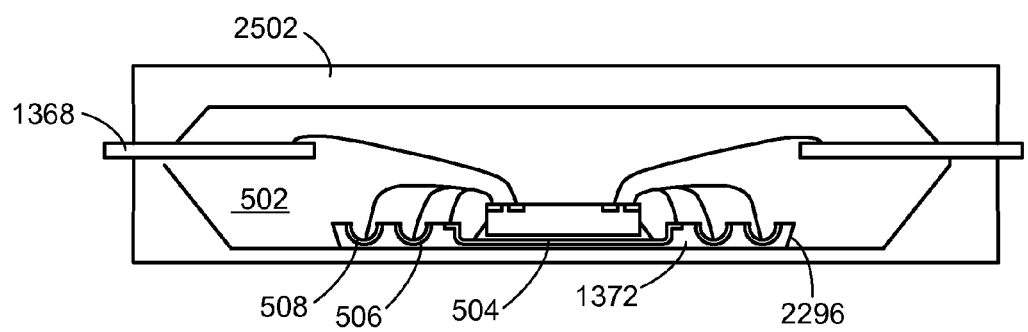
FIG. 25 is a cross-sectional view the integrated circuit package system of FIG. 6 in forming the encapsulation.

Referring now to FIG. 25, therein is shown a cross-sectional view the integrated circuit package system of FIG. 6 in forming the encapsulation 502. The structure of FIG. 21 can be placed between mold chases 2502 by the structure clamped at the external connectors 1368. The first terminal 504, the second terminals 506, and the third terminals 508 can be within the paddle 1372. The mold chases 2502 do not include the indent 2296 of FIG. 22 to accommodate for the protrusion from the paddle 1372.

Figure 26:
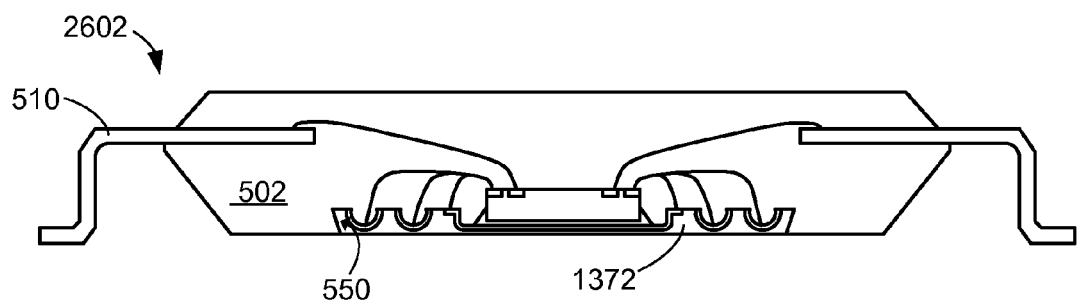
FIG. 26 is the structure of FIG. 25 in singulating an integrated circuit package structure.

Referring now to FIG. 26, therein is shown the structure of FIG. 25 in singulating an integrated circuit package structure 2602. The structure of FIG. 25 can also undergo singulation separating the structure having the encapsulation 502 and the external connectors 1368 of FIG. 25 extending therefrom. The external connectors 1368 can be bent to form the external interconnects 510. The paddle 1372 can be in the non-peripheral cavity 550 of the encapsulation 502.

Figure 27:
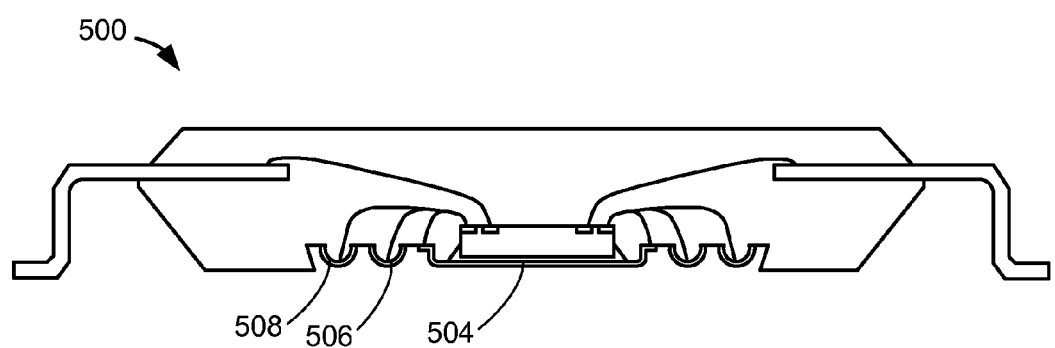
FIG. 27 is the structure of FIG. 26 in forming the integrated circuit package system of FIG. 6.

Referring now to FIG. 27, therein is shown the structure of FIG. 26 in forming the integrated circuit package system 500 of FIG. 6. The structure of FIG. 26 can undergo a removal process to remove the paddle 1372 of FIG. 26. The paddle 1372 can be removed by a number of processes. For example, the structure of FIG. 26 can be placed in a removing solution (not shown), such as an etchant solution, to remove the paddle 1372 exposing the first terminal 504, the second terminals 506, and the third terminals 508. As another example, the paddle 1372 can be removed by a spray method where the spray removes the paddle 1372. The removal of the paddle 1372 can form the integrated circuit package system 500.

Figure 28:
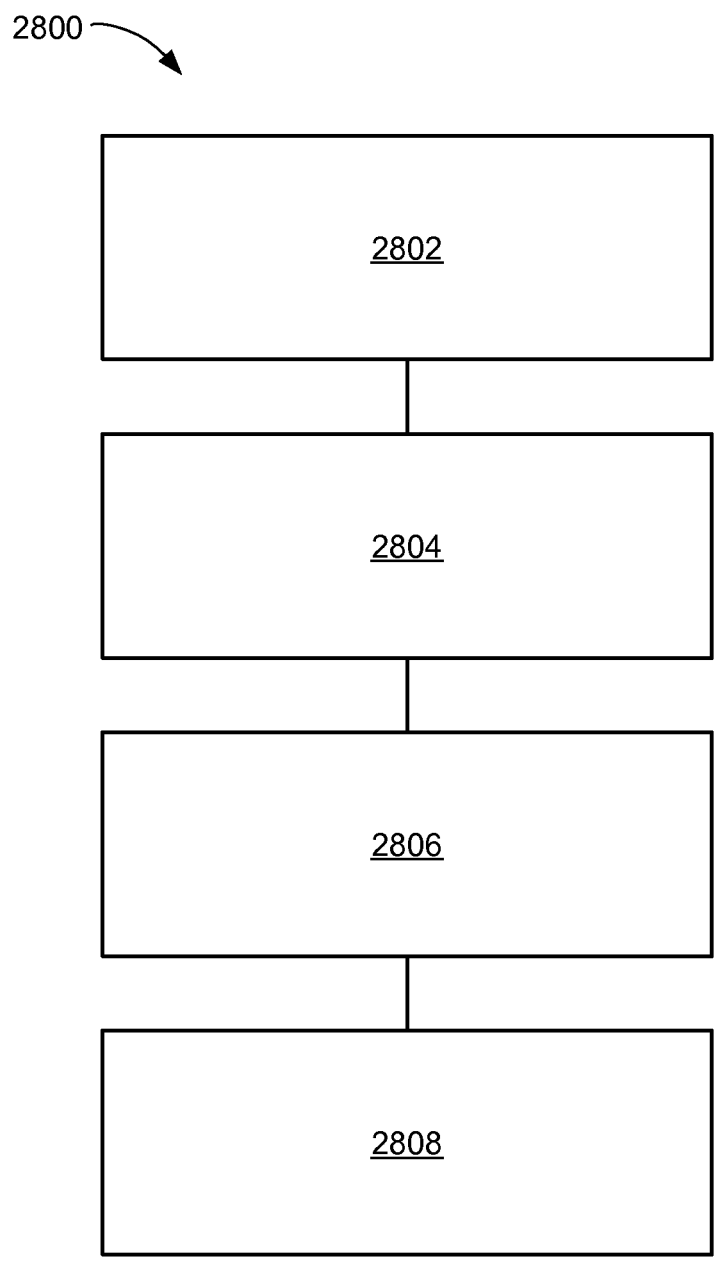
FIG. 28 is a flow chart of an integrated circuit package system for manufacture of the integrated circuit package system in an embodiment of the present invention.

Referring now to FIG. 28, therein is shown a flow chart of an integrated circuit package system 2800 for manufacture of the integrated circuit package system 100 in an embodiment of the present invention. The system 2800 includes forming an external interconnect in a block 2802; forming a terminal having a cavity adjacent to and downset from a portion the external interconnect in a block 2804; connecting a first integrated circuit with the external interconnect in a block 2806; and forming an encapsulation over the first integrated with cavity filled with the encapsulation, the terminal extending from the encapsulation, and the external interconnect partially exposed from the encapsulation in a block 2808.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
forming an external interconnect;
forming a terminal having a cavity adjacent to and downset from a portion of the external interconnect;
connecting a first integrated circuit with the external interconnect;
forming a first adhesive on and partially covering a portion of a vertical side of the first integrated circuit; and
forming an encapsulation over the first integrated circuit with the cavity filled with the encapsulation, the terminal extending a first height below a bottom surface of the encapsulation, and the external interconnect partially exposed from the encapsulation including establishing a stand-off height of the external interconnect greater than the first height.

2. The method as claimed in claim 1 further comprising exposing the terminal and the external interconnect from a first side of the encapsulation.

3. The method as claimed in claim 1 wherein forming the encapsulation includes forming the encapsulation having a non-peripheral cavity.

4. The method as claimed in claim 1 wherein forming the terminal includes:
forming a first terminal having a first cavity and with the first integrated circuit mounted therein; and
forming a second terminal, having a second cavity, adjacent to the first terminal.

5. The method as claimed in claim 1 wherein forming the external interconnect includes forming the external interconnect bent towards a first side of the encapsulation exposing the terminal.

6. A method for manufacturing an integrated circuit package system comprising:
forming an external interconnect;
forming a first terminal having a first cavity and a second terminal having a second cavity with the first terminal and the second terminal adjacent to and downset from a portion of the external interconnect;
mounting a first integrated circuit over the first terminal with a first adhesive, the first adhesive on and partially covering a portion of a vertical side of the first integrated circuit;
connecting the first integrated circuit with the external interconnect; and
forming an encapsulation over the first integrated circuit with the first cavity and the second cavity filled with the encapsulation, the first terminal extending a first height below a bottom surface of the encapsulation, and the external interconnect partially exposed from the encapsulation including establishing a stand-off height of the external interconnect eater than the first height.

7. The method as claimed in claim 6 further comprising mounting a second integrated circuit over the first integrated circuit.

8. The method as claimed in claim 6 further comprising mounting an external device to the second terminal.

9. The method as claimed in claim 6 wherein connecting the first integrated circuit includes connecting the second terminal.

10. The method as claimed in claim 6 wherein mounting the first integrated circuit includes mounting the first integrated circuit over the second terminal.

11. An integrated circuit package system comprising:
an external interconnect;
a terminal having a cavity adjacent to and downset from a portion of the external interconnect;
a first integrated circuit connected with the external interconnect;
a first adhesive on and partially covering a portion of a vertical side of the first integrated circuit; and
an encapsulation over the first integrated circuit with the cavity filled with the encapsulation, the terminal extending a first height below a bottom surface of the encapsulation, and the external interconnect partially exposed from the encapsulation includes a stand-off height of the external interconnect greater than the first height.

12. The system as claimed in claim 11 wherein the terminal and the external interconnect are exposed from a first side of the encapsulation.

13. The system as claimed in claim 11 wherein the encapsulation includes a non-peripheral cavity.

14. The system as claimed in claim 11 wherein the terminal includes:
a first terminal having a first cavity and with the first integrated circuit mounted therein; and
a second terminal, having a second cavity, adjacent to the first terminal.

15. The system as claimed in claim 11 wherein the external interconnect is bent towards a first side of the encapsulation with the terminal exposed.

16. The system as claimed in claim 11 wherein:
the terminal includes a first terminal having a first cavity and a second terminal having a second cavity with the first terminal and the second terminal adjacent to and downset from a portion of the external interconnect;
the first integrated circuit is over the first terminal; and
the encapsulation fills the first cavity and the second cavity.

17. The system as claimed in claim 16 further comprising a second integrated circuit over the first integrated circuit.

18. The system as claimed in claim 16 further comprising an external device mounted to the second terminal.

19. The system as claimed in claim 16 wherein the first integrated circuit is connected with the second terminal.

20. The system as claimed in claim 16 wherein the first integrated circuit is mounted over the second terminal.

* * * * *

UNITED STATES PATENT AND TRADEMARK OFFICE
CERTIFICATE OF CORRECTION

| | | |
|---|---|---|
| PATENT NO. | : 8,455,988 B2 | Page 1 of 1 |
| APPLICATION NO. | : 12/168803 | |
| DATED | : June 4, 2013 | |
| INVENTOR(S) | : Caparas et al. | |

It is certified that error appears in the above-identified patent and that said Letters Patent is hereby corrected as shown below:

In the Specification:

1. Column 3, line 12, delete "of FIG. 1;" and insert therefor --of FIG. 11;--

In the Claims:

2. Column 17, claim 6, line 55, delete "eater than" and insert therefor --greater than--

Signed and Sealed this
Seventeenth Day of November, 2015

Michelle K. Lee
*Director of the United States Patent and Trademark Office*